United States Patent [19]

Bouwer

[11] Patent Number: 4,522,489
[45] Date of Patent: Jun. 11, 1985

[54] DEVICE FOR PHOTOLITHOGRAPHICALLY TREATING A THIN SUBSTRATE

[75] Inventor: Adrianus G. Bouwer, Eindhoven, Netherlands

[73] Assignee: U.S. Philips Corporation, New York, N.Y.

[21] Appl. No.: 567,823

[22] Filed: Jan. 3, 1984

[30] Foreign Application Priority Data

Jan. 21, 1983 [NL] Netherlands ............ 8300220

[51] Int. Cl.$^3$ .................................... G03B 27/60
[52] U.S. Cl. ................................ 355/73; 355/53; 355/78
[58] Field of Search ............ 355/53, 73, 43, 45, 355/78; 414/676, 744 R, 757; 198/394; 406/87

[56] References Cited

U.S. PATENT DOCUMENTS

| 3,865,254 | 2/1975 | Johannsmeier | 355/78 X |
|---|---|---|---|
| 3,930,684 | 1/1976 | Lasch, Jr. et al. | 355/73 |
| 4,179,110 | 12/1979 | Kosugi et al. | 355/78 X |
| 4,239,381 | 12/1980 | Lacombat et al. | 355/73 X |
| 4,278,348 | 7/1981 | Funk et al. | 355/73 |
| 4,345,836 | 8/1982 | Phillips | 355/53 |
| 4,383,757 | 5/1983 | Phillips | 355/53 |
| 4,423,954 | 1/1984 | Curti | 355/73 |
| 4,425,037 | 1/1984 | Hershel et al. | 355/53 X |
| 4,444,492 | 4/1984 | Lee | 355/54 X |

Primary Examiner—Richard A. Wintercorn
Attorney, Agent, or Firm—Paul R. Miller

[57] ABSTRACT

A device for photolithographically treating a thin substrate comprises pre-alignment station, a substrate-supporting table and a transport arm which is provided with a vacuum connection for holding the substrate by suction at its lower side during transport of the substrate from the pre-alignment station to the substrate table. The substrate table is provided with supporting means for the substrate which are adjustable in the direction of height and which have a supporting surface which is adjustable to a distance above the substrate table exceeding the thickness of the transport arm and is adjustable in a downward direction at least through a distance such that the supporting surface is level with the upper surface of the substrate table, the supporting means leaving a space free for the movement of the transport arm above a part of the substrate table.

6 Claims, 4 Drawing Figures

DEVICE FOR PHOTOLITHOGRAPHICALLY TREATING A THIN SUBSTRATE

The invention relates to a device for photolithographically treating a thin substrate which is provided with a photosensitive layer on a major surface at the upper side of the substrate, which device comprises a pre-alignment station, a substrate table for holding the substrate during the photolithographic treatment and a transport arm which is provided with a vacuum connection for holding the substrate by suction at the lower side of the substrate during transport of the substrate from the pre-alignment station to the substrate table.

Such a device may be used, for example, for the manufacture of micro-circuits, in which patterns are projected onto a substrate which is provided with a photosensitive layer. In this case, the substrate has to be positioned very accurately with respect to a mask. In practice, the substrate is fed to a pre-alignment station where it is pre-aligned. The substrate is then picked up by the transport arm and carried to the substrate table, on which the fine alignment with respect to the mask is then effected. During the transport of the substrate to the substrate table the pre-alignment position has to be maintained with the greatest possible accuracy.

For the transport arm, an elongate flat strip is frequently used which is provided at one end with means for holding the substrate by means of suction and which is arranged at the other end to rotate about an axis to perform the transport movement. If the transport arm holds the substrate at the upper side thereof, photolacquer which may be present on this upper side might be damaged. When the substrate is held on the lower side, this disadvantage is avoided, but now it is difficult to place the substrate on the substrate table whilst maintaining the pre-alignment accuracy. Attempts can be made to meet this difficulty by providing in the substrate table a large recess in which the transport arm is adapted to move. After the substrate has been placed on the substrate table, the transport arm can be removed from the recess without influencing the position of the substrate. The substrate has to be flattened against the substrate table, for example, by means of vacuum or electrostatically, in order to obtain a correct focussing during exposure. Due to the comparatively large recess in the substrate table, however, the desired flatness of the substrate is not obtained.

The invention has for its object to provide a device of the kind mentioned in the opening paragraph, in which a transport arm can be used which has a large suction surface for the substrate, the substrate being held at its lower side during the transport, while the flatness of the substrate on the substrate table is disturbed only very slightly or not at all.

In order to achieve this, according to the invention, the substrate table is provided with supporting member for the substrate which are adjustable in the direction of height and which have a supporting surface which is adjustable to a distance above the substrate table exceeding the thickness of the part of the transport arm which serves to hold the substrate, the supporting means being adjustable in a downward direction at least through a distance such that said supporting surface is level with the upper surface of the substrate table, and the supporting means being so positioned in the substrate table as to leave a space free for moving the transport arm above a part of the substrate table.

In one embodiment of the invention, the supporting means comprise three cylindrical supporting elements having end faces which constitute the supporting surface, a resilient element being provided, which presses the supporting elements in an upward direction. In this embodiment, disturbance of the flatness of the substrate on the substrate table can be avoided because the cross-sectional area of the supporting elements can be small, which consequently results in openings of only small dimensions in the substrate table. The resilient element permits of obtaining a simple construction.

It is alternatively possible to have the height of the supporting surface continuously adjustable. In a suitable embodiment for this purpose, the supporting means comprise three cylindrical supporting elements, having end faces which constitute the supporting surface, which supporting elements are adjustable in the direction of height by means of a controllable driving mechanism.

In order to hold the substrate securely against displacement during the period in which it rests on the supporting means, the supporting means may be provided with at least one duct which opens out of the supporting surface and can be connected to a vacuum source.

The invention will be described more fully with reference to embodiments shown in the drawings.

Figure 1:
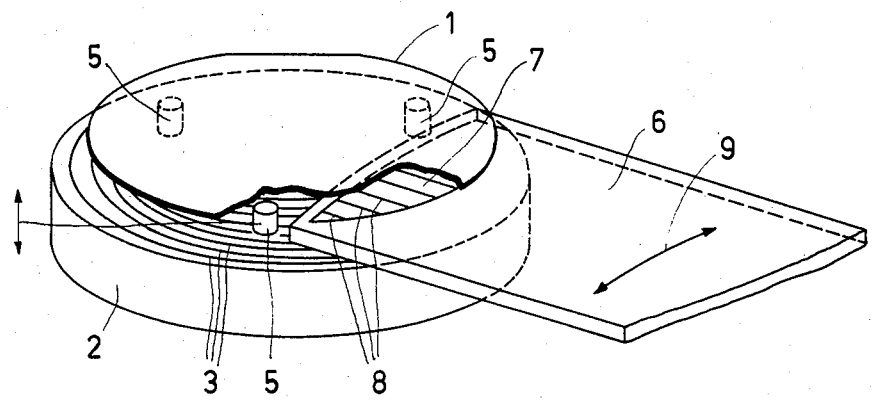
FIG. 1 is a perspective view of a substrate table and part of a transport arm for positioning a semiconductor wafer above the substrate table.

FIG. 1 shows a part of a device for photolithographically treating a substrate, such as a semiconductor wafer 1. For the sake of clarity, those parts of the device for photolithographically treating substrates which are not essential to the description of the invention are not shown in the drawing. For the known method of photolithographically treating substrates, reference is invited, for example, to Dutch Patent Application No. 8 101 668, in particular FIG. 13.

Figure 2:
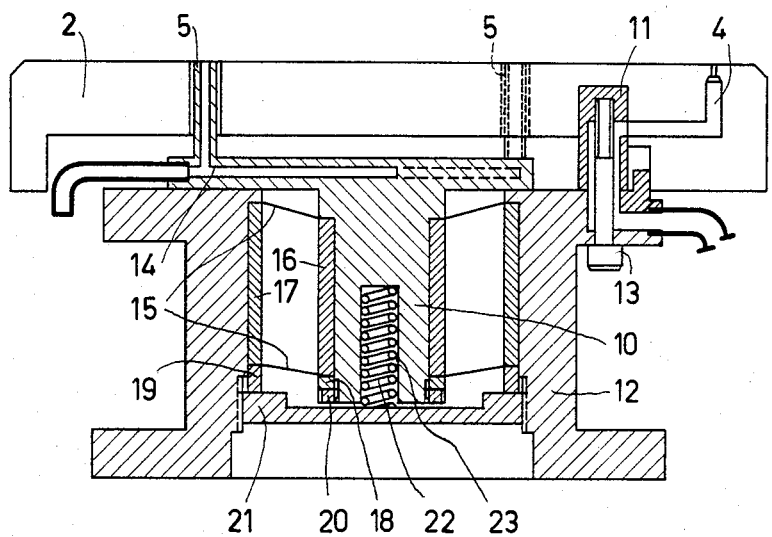
FIG. 2 is a sectional side view of the substrate table with the supporting means for the substrate.

As shown in FIG. 1, the substrate table 2 is provided with circular grooves in its upper surface, which grooves are in communication with a duct 4, shown in FIG. 2, which can be connected to a vacuum source. A substrate 1 which is placed on the substrate table can be held thereon by means of the resulting suction in the grooves 3. The device comprises a transport arm 6 which is provided at one end on its upper side with a vacuum connection 7. In the embodiment shown, the vacuum connection consists of grooves 8 which communicate with a duct (not shown) which extends through the transport arm and can be connected to a vacuum source. Such a transport arm is known per se and is not described further herein. The transport arm is arranged to pivot about a shaft (not shown) in the directions indicated by arrow 9. The transport arm 6 can pivot from a pre-alignment station (not shown) for a substrate to the substrate table and back again. A substrate 1 is fed to the pre-alignment station and positioned there with approximately the correct orientation. The substrate 1 is provided at its upper side with a photosensitive lacquer. In the pre-alignment station the transport arm grips the substrate by means of suction from the vacuum connection 7, the suction being applied to the lower side of the substrate to avoid damaging the photosensitive lacquer on the upper side. The transport arm then pivots to the substrate table 2 until the substrate 1 reaches the desired position above the substrate table 2.

The substrate table 2 comprises supporting means for the substrate, which supporting means are adjustable in the direction of height. In the embodiment shown in FIG. 1, the supporting means comprises three tubular supporting elements 5 which can be connected to a source of vacuum. The supporting means can be moved upwards through a distance such that the tubular supporting elements 5 project above the substrate table for a distance exceeding the thickness of the transport arm. The supporting elements 5 are positioned at a distance from the centre of the substrate table 2 such that on the one hand they are capable of adequately supporting the substrate 1 and on the other hand they leave sufficient room for the transport arm 6 so that a portion of the transport arm which includes and is slightly larger than the part occupied by the vacuum connection 7 can be positioned above the substrate table 2.

When the substrate 1 has been positioned above the substrate table by the transport arm 6, the supporting elements 5, projecting above the substrate table, are connected to vacuum so as to hold the substrate 1 by suction. The vacuum in the vacuum connection 7 of the transport arm 6 is then destroyed and the arm is pivoted to the pre-alignment station. The supporting elements 5 are moved downwards until the supporting surface of the supporting level with the upper surfaces at their upper ends are table. The suction grooves 3 now hold the substrate 1.

The substrate has thus been placed on the substrate table without the transport arm having touched the upper side of the substrate 1, which side is provided with photolacquer. The substrate table itself need not have a recess for the transport arm. The upper surface of the substrate table has only recesses of very small size due to the suction grooves 3 and the supporting elements 5. These irregularities are so small that the substrate 1 is completely flattened against the substrate table under the influence of the vacuum in the grooves 3.

Figure 3:
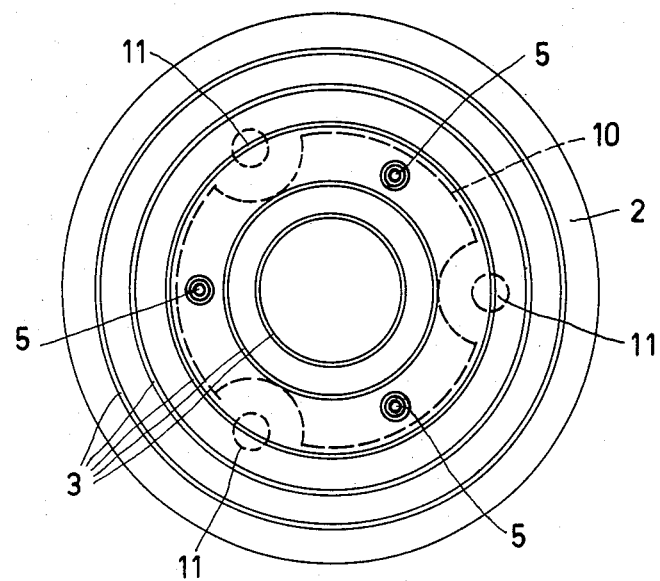
FIG. 3 is a plan view of the substrate table.

FIGS. 2 and 3 shown an embodiment of the substrate table 2 with a supporting member 10. The substrate table 2 is provided on its lower side with three sleeves 11 which bear on the upper surface of a frame 12. By means of screws 13 the substrate table is rigidly secured to the frame. The substrate table is formed with a duct 4 which can be connected to a source of vacuum and which opens into one of the suction grooves 3 in the upper surface of the substrate table 2. The connection of the other grooves 3 to the source of vacuum is not shown for the sake of clarity.

The supporting member 10 is provided with three tubular supporting elements 5. The supporting elements 5 can be connected through duct 14 to a source of vacuum. The supporting member 10 is suspended in the frame 12 by resilient elements 15. The resilient elements are clamped at their inner and the outer edges by sleeves 16 and 17 and rings 18 and 19. Pressure is exerted on the ring 18 by means of a threaded ring 20 and on the ring 19 by means of a closure disk 21 which is threaded at its periphery. A spring 22 which is accommodated in a cylindrical cavity 23 exerts an upwardly directed force on the supporting member 10.

The spring 22 can raise the supporting elements 5 above the substrate table until the supporting member 10 abuts against the lower side of the substrate table. In this position, a substrate can be placed on the supporting elements by means of the transport arm. Due to the sub-atmospheric pressure in the duct 14 the substrate is held by the supporting elements 5. A pressure member (not shown) can be carried above the substrate, which pressure member has a flat pressure surface provided with openings through which compressed air can flow in order to obtain an air bearing between the pressure member and the substrate. Thus, the substrate is not touched and damaged when it is pressed by the pressure member in the downward direction onto the substrate table. The suction grooves then hold the substrate despite the action of the spring 22 and the pressure member can be removed. This position, in which the upper ends of the tubular supporting elements 5 are level with the upper surface of the substrate table, is shown in FIG. 2.

It should be appreciated that the supporting elements may have a form different from a tubular form, but the tubular form is to be preferred because the disturbance of the supporting surface of the substrate table is then minimal.

Figure 4:
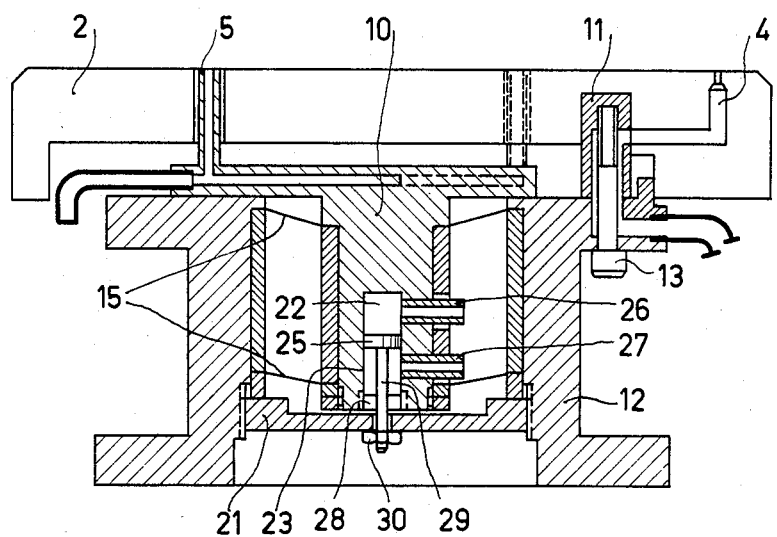
FIG. 4 is a sectional side view similar to FIG. 2, showing an embodiment in which adjustment of the supporting means can be effected by means of compressed air.

FIG. 4 shows an embodiment which essentially corresponds to the embodiment of FIG. 2, but in which the supporting elements are adjustable in the direction of height by a controllable driving mechanism; FIG. 4 shows by way of example a mechanism which is operated by compressed air. This mechanism comprises a piston 25 which can move up and down in the cavity 23. Tubes 26 and 27 connect the cavity above and below the piston to adjustable sources of compressed air, which are not shown. The lower end of the cavity 23 is closed by a disk 28 which is screwed into the cavity 23. The piston rod 29 passes through an opening in the disk 28 and is secured to the closing disk 21 by means of a nut 30.

When compressed air is admitted through the tube 26, the supporting member 10 will be moved upwards. The admission of compressed air through the tube 27 will produce a downwardly directed force on the supporting member 10. The supporting elements are thus adjustable in the direction of height to any desired position. It should be appreciated that a controllable driving mechanism for moving the supporting in the direction of height may alternatively be constructed in a different manner.

What is claimed is:

1. A device for photolithographically treating a thin substrate which is provided with a photosensitive layer on a major surface at the upper side of the substrate, which device comprises a pre-alignment station, a substrate table for holding the substrate during the photolithographic treatment and a transport arm which is provided with a vacuum connection for holding the substrate by suction at the lower side of the substrate during transport of the substrate from the pre-alignment station to the substrate table, characterized in that the substrate table is provided with supporting means for the substrate which are adjustable in the direction of height and which have a supporting surface which is adjustable to a distance above the substrate table exceeding the thickness of the part of the transport arm which serves to hold the substrate, the supporting means being adjustable in a downward direction at least through a distance such that said supporting surface is level with the upper surface of the substrate table, and the supporting means being so positioned in the substrate table as to leave a space free for the movement of the transport arm above a part of the substrate table.

2. A device as claimed in claim 1, characterized in that the supporting means comprise three cylindrical supporting elements having end faces which constitute the supporting surface, a resilient element being provided which presses the supporting elements in an upward direction.

3. A device as claimed in claim 1, characterized in that the supporting member comprises three cylindrical supporting elements having end faces which constitute the supporting surface, these supporting elements being adjustable in the direction of height by means of a controllable driving mechanism.

4. A device as claimed in claim 3, characterized in that the supporting means are provided with a least one duct which opens out of the supporting surface and can be connected to a vacuum source.

5. A device as claimed in claim 2, characterized in that the supporting means are provided with at least one duct which opens out of the supporting surface and can be connected to a vacuum source.

6. A device as claimed in claim 1, characterized in that the supporting means are provided with at least one duct which opens out of the supporting surface and can be connected to a vacuum source.

* * * * *